(12) United States Patent
Gulachenski et al.

(10) Patent No.: US 6,943,454 B1
(45) Date of Patent: Sep. 13, 2005

(54) MEMORY MODULE

(75) Inventors: Alan Michael Gulachenski, Hopkinton, MA (US); Gary P. Pirani, Holden, MA (US); Bob Khederian, Canton, MA (US); Mark Downey, Jefferson, MA (US)

(73) Assignee: White Electronic Designs Corp., Phoenix, AZ (US)

( * ) Notice: Subject to any disclaimer, the term of this patent is extended or adjusted under 35 U.S.C. 154(b) by 0 days.

(21) Appl. No.: 10/445,283

(22) Filed: May 23, 2003

(51) Int. Cl.7 ............................................. H01L 23/48
(52) U.S. Cl. ...................... 257/777; 438/107; 438/109
(58) Field of Search ............................... 257/777, 778; 438/107, 109

(56) References Cited

U.S. PATENT DOCUMENTS 6,713,854 B1 * 3/2004 Kledzik et al. ............. 257/686

2003/0112614 A1 * 6/2003 Tay et al. .................... 361/767
2004/0084771 A1 * 5/2004 Bolken et al. .............. 257/738

* cited by examiner

Primary Examiner—Christian Wilson
(74) Attorney, Agent, or Firm—Kriegsman & Kriegsman

(57) ABSTRACT

A memory module for an electronic system, such as a personal computer or server, includes a double-sided, 184-pin, dual in-line memory module printed circuit board. A plurality of individual electronic components are mounted on both sides of the printed circuit board. Each electronic component includes an electronic component printed circuit board, a first pair of stacked memory dies electrically connected to the electronic component printed circuit board, a second pair of stacked memory dies electrically connected to the electronic component printed circuit board, and a thin small outline ball grid array package at least partially encapsulating the first and second pairs of stacked memory dies. Preferably, an insulator is disposed between each pair of stacked memory dies.

15 Claims, 3 Drawing Sheets

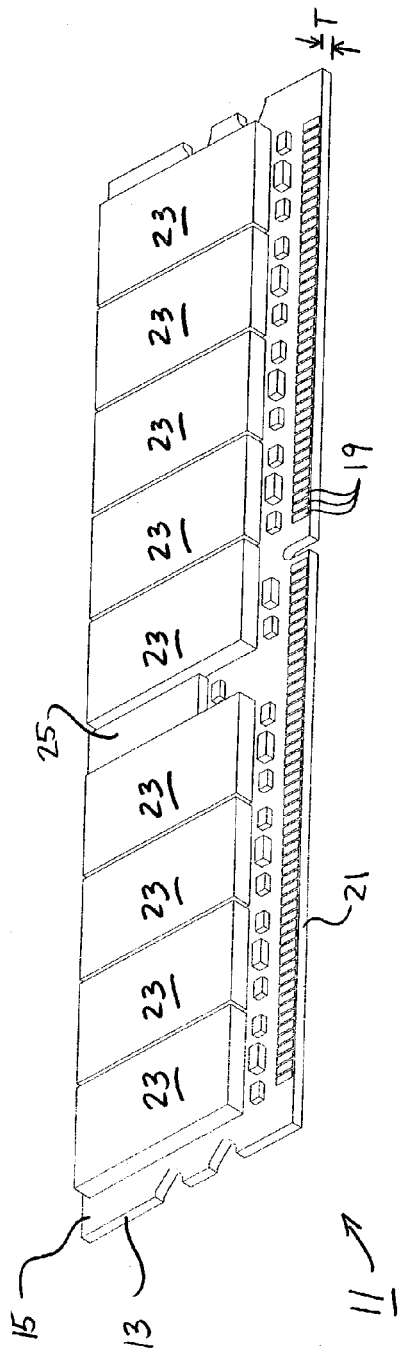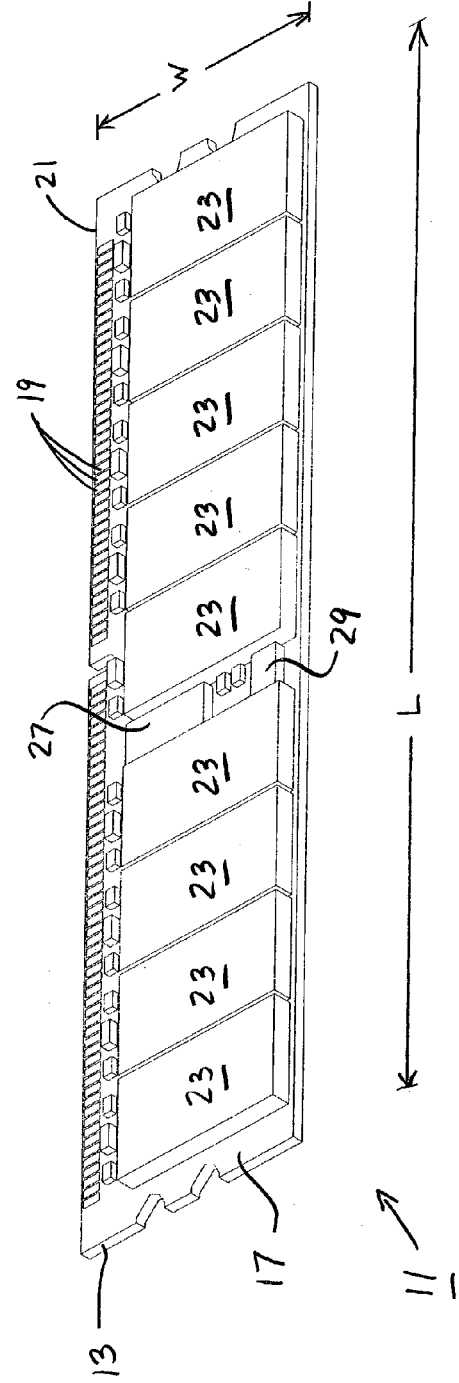
FIG. 1
FIG. 2

MEMORY MODULE

BACKGROUND OF THE INVENTION

The present invention relates generally to electronic systems and more particularly is directed to memory modules.

Memory modules are well known in the art and are commonly used in a wide variety of electronic systems, such as computer systems, to store data.

Memory modules typically comprise a circuit board, such as a printed circuit board, and one or more electronic components, such as integrated circuit (IC) memory chips, which are mounted directly on the circuit board. The circuit board is a substrate which electrically connects the electronic components mounted thereon in a desired configuration to form the functional memory module.

As noted above, memory modules are commonly used to store data for computer systems. Accordingly, memory modules typically include a plurality of connection points, such as a comb of printed terminals, formed along one edge which serve to electrically connect the memory module to the motherboard of the desired computer system. Specifically, memory modules are typically constructed in such a manner so that the plurality of connection points can be electrically and mechanically coupled to the motherboard of the desired computer system through a corresponding electrical connector.

It should be noted that the number and configuration of the connection points, or pins, on the memory module circuit board are commonly used to classify the memory module (e.g., a single in-line memory module (SIMM), dual in-line memory module (DIMM), etc.). Presently, computer industry standards mandate that computer systems be able to receive memory modules having a particular configuration and number of connection points (e.g., a 184-pin dual in-line memory module).

Designers of memory modules are constantly striving to increase, or expand, the memory capacity, or density, of memory modules. However, as noted briefly above, industry promulgated standards mandate that memory modules be designed to mechanically and electrically engage with a particular type of computer system electrical connector. Furthermore, because computer system designers typically limit the space within the housing of a computer system that is designated to receive a memory module, memory module designers are typically required to expand the module density of memory modules without significantly increasing its overall size. As a result, memory module designers are required to increase the memory capacity of memory modules while enabling each module to fit within the footprint of an industry-promulgated electrical connector and, at the same time, within the relatively confined space within the interior of the computer system which is designated for the memory module.

Design engineers utilize numerous well-known techniques to increase the memory density of a memory module without changing the size and/or connection point configuration of its circuit board.

As an example, memory module designers often use circuit boards which allow for electronic components to be mounted on both of its sides (this type of circuit board being referred to simply as a double-sided circuit board in the art). As can be appreciated, double-sided circuit boards enable design engineers to increase the number of electrical components which can be mounted on the circuit board, thereby increasing its overall density, without changing the size of the circuit board, which is highly desirable.

As another example, memory module designers often utilize individual electronic components of reduced size and of increased memory capacity, which is highly desirable.

As another example, memory module designers have, on occasion, coupled together multiple memory modules through the use of rigid flex technology. Specifically, a primary circuit board comprising the plurality of connection points is electrically coupled to a secondary circuit board through a flex circuit, each of the primary and secondary circuit boards having a plurality of electronic components mounted thereon. It should be noted that the flexibility of the flex circuit enables the primary and secondary circuit boards to be closely disposed in a substantially parallel configuration.

In U.S. Pat. No. 5,224,023 to G. W. Smith et al, there is disclosed an electronic assembly which combines a number of commensurate printed circuit boards that are bonded to a common, flexible, interconnecting substrate in an alternately folded and layered arrangement against an end board that has a comb of terminals for mounting into a motherboard connector. The flexible substrate is sandwiched between half-sections of each board, allowing mounting of components from both faces of the board. The assembly is particularly indicated for high density applications such as memory modules.

Although effective in increasing module density while maintaining the same height and electrical connector footprint as a memory module comprising a single printed circuit board, memory modules of the type described above which use rigid flex technology to connect multiple circuit boards together experience a few notable drawbacks.

As one drawback, memory modules which utilize rigid flex technology have been found to have a limited operating speed, which is highly undesirable. Specifically, it has been found that the speed in which signals can travel through the flex circuit is significantly limited. As such, a signal sent from an electronic component on the secondary circuit board reaches the comb of printed terminals on the primary circuit board significantly later (e.g., approximately 2 nanoseconds) than a signal sent from an electronic component on the primary circuit board. As a result, the memory module has a speed threshold which is limited to the speed in which signals can travel from the electronic components on the secondary circuit board to the comb of terminals on the primary circuit board. As can be appreciated, the calculated speed threshold for memory modules which utilize rigid flex technology has been found to be unacceptable in many present applications.

As another drawback, memory modules which utilize rigid flex technology have been found, at times, to perform inadequately, which is highly undesirable. Specifically, due to the significant length of the flexible substrate which connects the primary and secondary circuit boards, a signal generated from an electronic component on the secondary circuit board is required to travel along a relatively long trace length which, in turn, can result in integrity loss to the signal. As can be appreciated, it has been found that signals which travel along a trace length greater than 1.5 inches often experience significant integrity loss.

As another drawback, memory modules which utilize rigid flex technology have been found to be relatively expensive to manufacture, which is highly undesirable. Specifically, the cost associated with the flexible substrate is considerably high and, as a consequence, greatly increases the total overall cost of the memory module.

As another drawback, memory modules which utilize rigid flex technology have a considerably greater width (i.e., thickness) than other types of conventional memory modules, which is highly undesirable.

Accordingly, in order to increase the memory density of a memory module without changing the number, type and/or size of its circuit boards, memory module designers often assemble stacks of multiple (e.g., two, four, etc.) electronic components and, in turn, mount the stacks directly onto the circuit board. When utilizing this technique, design engineers commonly stack electronic components (i.e., integrated circuits) having a thin small outline package (TSOP) with a dual in-line lead configuration. It should be noted that when using this technique, each electronic component is individually manufactured, each component comprising a memory die which is at least partially encapsulated within a thin small outline package which includes a plurality of externally-accessible conductive pins. During the process of manufacturing of the memory module, the individual electronic components are stacked one on top of another such that the pins of every component in a stack are electrically connected together. In other words, the pins for each successively stacked component are connected to the pins of the component on which it is stacked (either directly or through a thin printed circuit board). The stacked components are then connected to the printed circuit board for the memory module.

As can be appreciated, by stacking TSOP electronic components on top of one another, design engineers are able to significantly increase the memory capacity of memory modules without increasing the overall height or length of the module and without compromising the signal speed capabilities of the memory module, which is highly desirable.

However, memory modules of the type described above which include stacked TSOP electronic components suffer from a few notable drawbacks.

As one drawback, memory modules of the type described above which include stacked TSOP electronic components often experience unacceptable signal degradation, which is highly undesirable. Specifically, stacking multiple TSOPs on top of one another creates a significantly long trace length from the TSOP at the top of the stack to the circuit board. As can be appreciated, the increased trace length serves to add inductance and capacitance to the stack which, in turn, unacceptably delays a signal traveling from the stack to the circuit board.

As another drawback, memory modules of the type described above which include stacked TSOP electronic components are considerably greater in width (i.e., thickness), which is highly undesirable. Specifically, stacking electronic components on both sides of a circuit board serves to increase the overall width of the memory module by roughly the increase height of the largest stack on each side of the circuit board. As noted above, due to space constraints, stacking electronic components on both sides of a circuit board often precludes such a memory module from fitting within the space within a computer which is designated for the memory module.

Another technique which is commonly used to increase the memory density of a memory module involves maximizing the number of electronic components which can be fit onto the front and rear surfaces of a standard memory module circuit board.

One well-known method for maximizing the number of electronic components which can be fit onto a circuit board involves the use electronic components which include a ball grid array (BGA) package. Specifically, a BGA package utilizes a plurality of conductive balls mounted on its bottom surface for electrically connecting the die within the package of the electronic component to the circuit board.

The utilization of electronic components which include a BGA package introduces a couple of notable advantages.

As a first advantage, the solder balls which are used to connect the die of the electronic component to the circuit board are connected to the bottom surface of the electronic component package. To the contrary, a dual in-line package utilizes a plurality of leads mounted along the sides of its package for electrically connecting the die of the electronic component to the circuit board. As can be appreciated, by mounting the conductive balls onto the bottom surface of its package, rather than along the sides of its package, the footprint required on the circuit board for each electronic component is significantly reduced. As a result, the number of electronic components which are capable of being mounted onto the circuit board is maximized.

As a second advantage, because the surface area of the bottom surface of the package is traditionally larger than the surface area of the sides of the package, by mounting the solder balls to the bottom surface, the electronic component is able to significantly increase the number of points of electrical contact between the die of the electrical component and the circuit board, which is highly desirable.

Another well-known method for maximizing the number of electronic components which can be fit onto a circuit board involves mounting each electronic component onto the circuit board without any packaging. Specifically, the die of each electronic component is mounted directly onto the circuit board without any packaging. As can be appreciated, with the packaging removed, the footprint of each electronic component is significantly reduced in some cases, thereby enabling more electronic components to be fit on the circuit board, which is highly desirable.

The aforementioned technique of mounting the die of each electronic component directly onto the circuit board without any packaging introduces one notable drawback. Specifically, the lack of packaging for each electronic component renders it incapable of most types of pre-testing (e.g., speed testing, temperature testing, etc.). As a result, if only one package-free electronic component which is mounted on the circuit board is found to be defective, the entire memory module can be significantly compromised. This compromising often necessitates the disposal of the memory module, thereby wasting all of the other properly functioning electronic components mounted on the circuit board. The discarding of a large number of properly functioning electronic components can produce a cost associated yield loss which is unacceptable.

In all of the aforementioned techniques for increasing the memory capacity of a memory module, it is to be understood that each electronic component used comprises only a single memory die which is either encapsulated in within a package or mounted directly onto the circuit board without any packaging.

In certain applications outside of the memory module industry, such as the cell phone and hand-held computer industries, it is known for a pair of different dies, each die uniquely designed to perform a particular function (e.g., a first die for controlling a device, such as a keyboard, and a second die for storing data), to be stacked on top of one another and encapsulated within a single thin small outline package. By encapsulating the pair of application specific dies within a common integrated circuit package, the internal architecture of the system in which said component is used can be considerably simplified.

SUMMARY OF THE INVENTION

It is an object of the present invention to provide a new and improved memory module.

It is another object of the present invention to provide a memory module which has a relatively high memory capacity.

It is yet another object of the present invention to provide a memory module as described above which has a relatively high performance level.

It is yet still another object of the present invention to provide a memory module as described above which includes a standard connection footprint.

It is still another object of the present invention to provide a memory module as described above which is limited in size.

It is another object of the present invention to provide a memory module as described above which has a limited number of parts and is inexpensive to manufacture.

Accordingly, there is provided a memory module comprising a first circuit board, and a plurality of electronic components mounted on said first circuit board, each electronic component comprising a first die, and a second die.

Various other features and advantages will appear from the description to follow. In the description, reference is made to the accompanying drawings which form a part thereof, and in which is shown by way of illustration, a specific embodiment for practicing the invention. The embodiment will be described in sufficient detail to enable those skilled in the art to practice the invention, and it is to be understood that other embodiments may be utilized and that structural changes may be made without departing from the scope of the invention. The following detailed description is therefore, not to be taken in a limiting sense, and the scope of the present invention is best defined by the appended claims.

BRIEF DESCRIPTION OF THE DRAWINGS

A fuller understanding of the nature and objects of the present invention will become apparent upon consideration of the following detailed description taken in connection with the accompanying drawings, wherein like reference numerals represent like parts:

FIG. 1 is top perspective view of a memory module constructed according to the teachings of the present invention;

FIG. 2 is a bottom perspective view of the memory module shown in FIG. 1;

DETAILED DESCRIPTION OF THE PREFERRED EMBODIMENT

Figure 3:
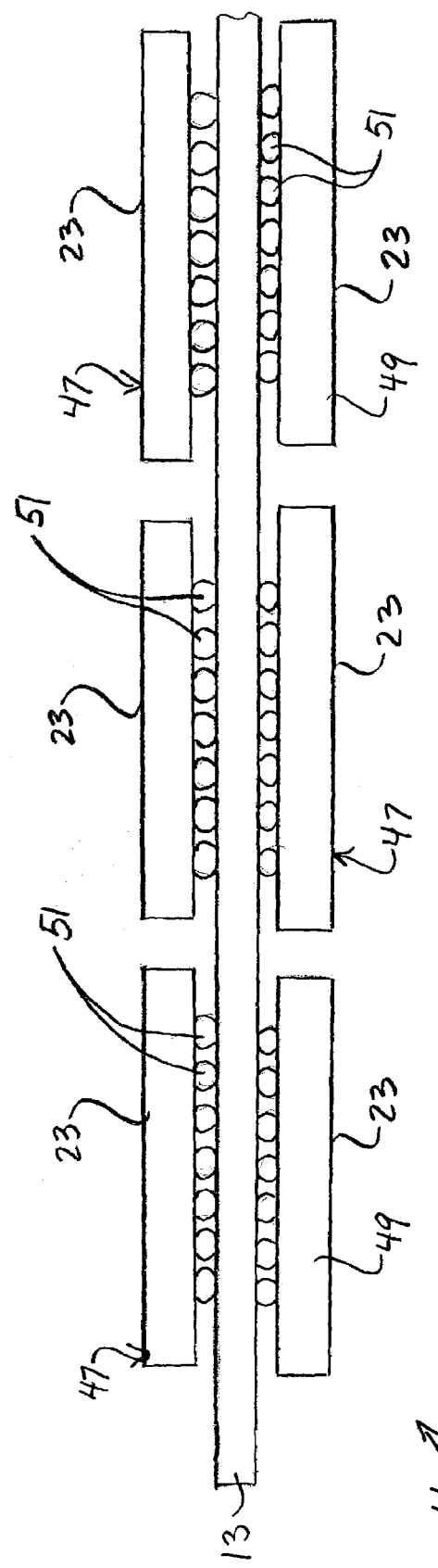
FIG. 3 is a fragmentary front plan view of the memory module shown in FIG. 2.

Referring now to FIGS. 1 and 2, there is shown a memory module constructed according to the teachings of the present invention, the memory module being identified generally by reference numeral 11. As will be described further below, memory module 11 is designed to be electrically coupled to the motherboard of an electronic system, such as a computer system. In this capacity, memory module 11 can be used as an internal storage device for a computer system.

Memory module 11 is a 2 gigabyte double data rate (DDR) synchronous dynamic random access memory (SDRAM) module which is organized as four banks of 64 megabytes per die×4 dies per electronic component×18 electronic components per module. As will be discussed further below, memory module 11 utilizes the same general size and configuration of electrical components (e.g., integrated circuits) as a conventional 1 gigabyte double data rate (DDR) synchronous dynamic random access memory (SDRAM) module.

Memory module 11 comprises a printed circuit board (PCB) 13. Printed circuit board 13 is preferably a double-sided printed circuit board constructed of a conventional substrate, such as FR-4 or another similar material. Printed circuit board 13 is generally rectangular in shape and includes a top surface 15 and a bottom surface 17. Printed circuit board 13 has the same dimensions as the printed circuit board of a conventional 1 gigabyte double data rate (DDR) synchronous dynamic random access memory (SDRAM) module. Specifically, printed circuit board 13 has a length L of approximately 5.255 inches, a width W of approximately 1.200 inches, and a thickness T of approximately 0.050 inches.

Printed circuit board 13 also comprises a plurality of electronic connection points, or pins, 19 which serve to electrically connect memory module 11 to the motherboard of a computer system, as will be described further below. Pins 19 are patterned as a comb of printed terminals which are formed along the length of an edge 21 of printed circuit board 13. As seen most clearly in FIGS. 1 and 2, printed circuit board 13 is designed such that ninety-two pins 19 are formed in a linear array on top surface 15 along edge 21 and ninety-two pins 19 are formed in a linear array on bottom surface 17 along edge 21.

The particular configuration of pins 19 on printed circuit board 13 renders memory module 11 of the 184-pin, dual in-line memory module (DIMM) variety. As such, memory module 11 is designed for installation into a corresponding 184-pin DIMM connector. Because conventional computer systems commonly include at least one 184-pin DIMM connector mounted on its motherboard, it is to be understood that memory module 11 is adapted to be readily installed into most conventional computer systems, which is highly desirable.

It should be noted that memory module 11 is not limited to being of the 184-pin DIMM variety. Rather, it is to be understood that memory module 11 could be of other types (e.g., a 200-pin small outline dual in-line memory module) without departing from the spirit of the present invention.

Memory module 11 additionally comprises a plurality of electronic components 23 which are electrically connected to the circuitry of printed circuit board 13. Specifically, memory module 11 comprises eighteen electronic components 23, nine electronic components 23 being mounted on top surface 15 in a side-by-side relationship and nine electronic components 23 being mounted on bottom surface 17 in a side-by-side relationship.

Memory module 11 additionally comprises a register 25 mounted on top surface 15, a phase locked loop (PLL) 27 mounted on bottom surface 17, and a serial programmable device (SPD) 29 mounted on bottom surface 17. Together, register 25, PLL 27, and SPD 29 serve as auxiliary logic devices which improve the interface between the memory module 11 and the motherboard of the computer system on which memory module 11 is installed.

It should be noted that the aforementioned auxiliary logic devices could be eliminated from memory module 11 without departing from the spirit of the present invention. In fact, it is to be understood that the aforementioned auxiliary logic devices could alternatively be mounted onto the motherboard of the computer system (or the motherboard of the computer system could be designed so as to not require any auxiliary logic devices) without departing from the spirit of the present invention.

It should also be noted that memory module 11 is designed such that electronic components 23 are mounted on printed circuit board 13 in the same general configuration (i.e., the same number and location of components) in which a conventional 1 gigabyte double data rate (DDR) synchronous dynamic random access memory (SDRAM) module mounts its individual electronic components on its printed circuit board. In addition, it should be noted that each electronic component 23 for memory module 11 has approximately the same dimensions as each electronic component for a conventional 1 gigabyte double data rate (DDR) synchronous dynamic random access memory (SDRAM) module. As a result, memory module 11 is provided with the same footprint and approximately the same overall dimensions (but with approximately two times the memory capacity) as a conventional 1 gigabyte double data rate (DDR) synchronous dynamic random access memory (SDRAM) module, which is highly desirable.

As will be described further below, the ability of memory module 11 to approximately double the memory capacity of a conventional 1 gigabyte double data rate (DDR) synchronous dynamic random access memory (SDRAM) module without significantly increasing its overall dimensions is accomplished primarily by increasing the memory capacity of each electronic component 23 without considerably increasing the size of each electronic component package.

Figure 4:
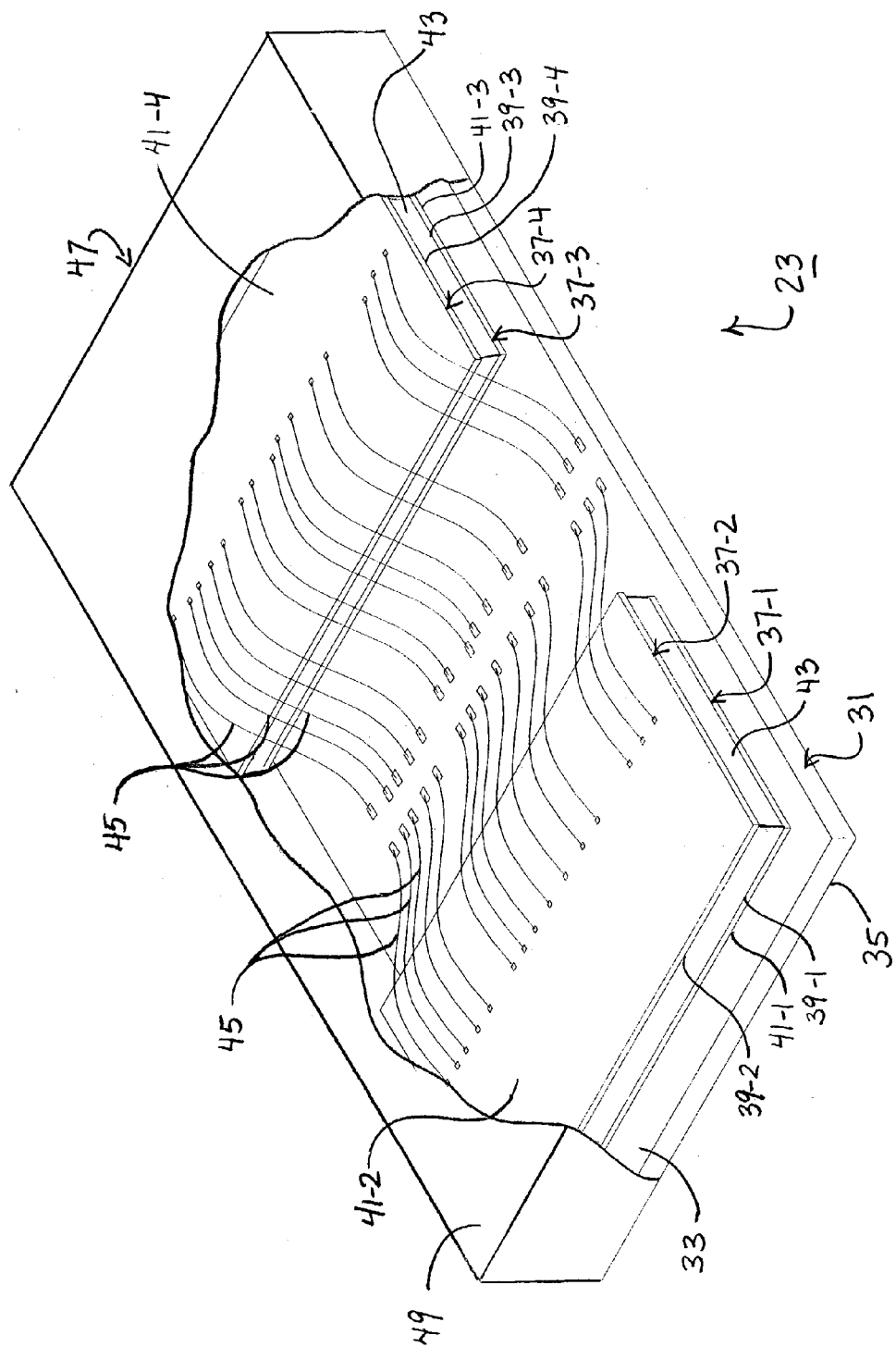
FIG. 4 is a enlarged top perspective view, broken away in part, of one of the electronic components shown in FIG. 1.

Referring now to FIGS. 3 and 4, each electronic component 23 is represented herein as being in the form of an integrated circuit (IC) with approximately 1 gigabyte of data storage capacity. As will be described further below, each component 23 is not limited to a particular data storage capacity. Rather, it is to be understood that each component 23 could be modified to have a different data storage capacity, such as 512 megabytes, without departing from the spirit of the present invention.

Each electronic component 23 comprises a printed circuit board 31 constructed of a conventional substrate, such as FR-4 or another suitable material. Printed circuit board 31 is generally rectangular in shape and includes a top surface 33 and a bottom surface 35.

As seen most clearly in FIG. 4, two stacked pairs of dies 37 are disposed in a side-by-side manner on printed circuit board 31. Each die 37 has approximately 32 megabytes of storage capacity and is shaped to include a bottom side 39 (also referred to herein as back side 39) on which there are located no active circuits and a top side 41 on which the active circuits for die 37 are located. As can be appreciated, the inclusion of four identical dies 37 within a single integrated circuit package serves to provide electronic component 23 with its high storage capacity (approximately 128 megabytes), which is highly desirable.

First die 37-1 is inverted and is mounted onto circuit board 31. Specifically, top side 41-1 of first die 37-1 is electrically coupled to top surface 33 of printed circuit board 31 using a solder bumping process (or, in the alternative, using an electrically conductive adhesive, such as epoxy). In this manner, an electrical path is established between first die 37-1 and printed circuit board 31. A thin insulator 43 having approximately the same lateral cross-section as first die 37-1 is preferably disposed on bottom side 39-1 of first die 37-1. Furthermore, a second die 37-2 is orientated right side up (i.e., with its active side up) and is mounted on insulator 43 such that bottom side 39-2 of second die 37-2 is disposed in contact against the free surface of insulator 43, thereby enabling insulator 43 to serve as a layer of insulation between bottom side 39-1 of first die 37-1 and bottom side 39-2 of second die 37-2. A plurality of wires 45 constructed of an electrically conductive material, such as gold, are connected at one end to top side 41-2 of second die 37-2 and at the other end to top surface 33 of printed circuit board 31. In this manner, an electrical path is established between second die 37-2 and printed circuit board 31.

Similarly, third die 37-3 is inverted and is mounted onto circuit board 31. Specifically, top side 41-3 of third die 37-3 is electrically coupled to top surface 33 of printed circuit board 31 using a solder bumping process (or, in the alternative, an electrically conductive adhesive, such as epoxy). In this manner, an electrical path is established between third die 37-3 and printed circuit board 31. A thin insulator 43 having approximately the same lateral cross-section as third die 37-3 is preferably disposed on bottom side 39-3 of third die 37-3. Furthermore, a fourth die 37-4 is orientated right side up (i.e., with its active side up) and is mounted on the free surface of insulator 43 such that bottom side 39-4 of fourth die 37-4 is disposed in contact against insulator 43, thereby enabling insulator 43 to serve as a layer of insulation between bottom side 39-4 of fourth die 37-4 and bottom side 39-3 of third die 37-3. A plurality of wires 45 constructed of an electrically conductive material, such as gold, are connected at one end to top side 41-4 of fourth die 37-4 and at the other end to top surface 33 of printed circuit board 31. In this manner, an electrical path is established between fourth die 37-4 and printed circuit board 31.

Printed circuit board 31, dies 37, insulators 43 and wires 45 are all encapsulated within a thin small outline ball grid array (BGA) package 47. Specifically, BGA package 47 comprises a protective plastic compound 49 which encapsulates at least a portion of PCB 31, dies 37, insulators 43 and wires 45. In addition, BGA package 47 comprises a plurality of solder balls 51 which are mounted onto bottom surface 35 of printed circuit board 31, each solder ball 51 being mounted in electrical connection with printed circuit board 31. As can be appreciated, the particular construction of BGA package 47 enables electronic components 25 to be mounted on printed circuit board 13 using well-known, high density, ball grid array surface mounting techniques.

With memory module 11 in its assembled form and properly installed onto the motherboard of a computer system through a conventional 184-pin DIMM connector, a signal generated by a die 37 would travel to its corresponding printed circuit board 31, pass through its corresponding solder balls 51, and flow into printed circuit board 13 for memory module 11. The signal would then travel from printed circuit board 31 into pins 19 which electrically contact complimentary terminals present on the 184-pin DIMM connector for the desired computer system.

It should be noted that the storage capacity of memory module 11 could be modified by changing storage capacity of each individual die 37 present within each individual electronic component 23. For example, by replacing each die 37 with a die having a memory capacity of 64 megabytes, the overall memory capacity of the memory module could be effectively expanded to approximately 4 gigabytes.

It should also be noted that each stacked pair of dies 37 within electronic component 23 are represented herein as having identical dimensions. However, it is to be understood that each stacked pair of dies 37 could have different dimensions (e.g., the top die on each stack could be smaller in size) without departing from the spirit of the present invention.

Further, it should be noted that each insulator 43 is represented herein as having the identical length and width as an individual die 37. However, it is to be understood that each insulator 43 could have a different length and width than an individual die 37 without departing from the spirit of the present invention. For example, each insulator 43 could have a length and width which is less than an individual die 37. In this capacity, a smaller die could be positioned on top of a larger die to form a stack.

The embodiment shown in the present invention is intended to be merely exemplary and those skilled in the art shall be able to make numerous variations and modifications to it without departing from the spirit of the present invention. All such variations and modifications are intended to be within the scope of the present invention as defined in the appended claims.

What is claimed is:

1. A memory module comprising,
   (a) a first circuit board, and
   (b) a plurality of electronic components mounted on said first circuit board, each electronic component comprising,
      (i) a first memory die, and
      (ii) a second memory die stacked on said first memory die,
      (iii) an insulator disposed between the said first and second memory dies,
      (iv) a second circuit board on which the first memory die is mounted, said first and second memory dies being independently electrically connected to the second circuit board, said second memory die being electrically connected to said second circuit board through at least one conductive wire, and
      (v) a common package which at least partially encapsulates said first memory die, said second memory die, said insulator and said second circuit board.

2. The memory module as claimed in claim 1 wherein said first memory die, said second memory die, said insulator and said second circuit board are all at least partially encapsulated within a common thin small outline ball grid array (BGA) package.

3. The memory module as claimed in claim 2 wherein said first and second dies are identical.

4. The memory module as claimed in claim 1 wherein said first circuit board includes a plurality of electronic connection points.

5. The memory module as claimed in claim 4 wherein said first circuit board is a double-sided printed circuit board.

6. The memory module as claimed in claim 5 wherein said first circuit board is a 184-pin dual in-line memory module printed circuit board.

7. The memory module as claimed in claim 1 wherein each of said first and second memory dies includes a top side and a bottom side, said second memory die being stacked on said first memory die with said first memory die orientated in an inverted position and with said second memory die orientated with its top side facing up and away from said first memory die.

8. The memory module as claimed in claim 1 wherein said electronic component further comprises a third memory die and a fourth memory die.

9. The memory module as claimed in claim 8 wherein said first, second, third and fourth memory dies are all at least partially encapsulated within said common package.

10. The memory module as claimed in claim 9 wherein said fourth die is stacked on said third die.

11. The memory module as claimed in claim 10 wherein said first and third memory dies are mounted on the same surface of said second circuit board in a spaced apart, side-by-side relationship.

12. A memory module, comprising
    (a) a first circuit board, and
    (b) an electronic component mounted on said first circuit board, said electronic component comprising,
       (i) a second circuit board,
       (ii) a first pair of stacked memory dies mounted on said second circuit board,
       (iii) a second pair of stacked memory dies mounted on said second circuit board, said first and second pairs of stacked memory dies being independently mounted on said second circuit board in a spaced apart and side-by-side relationship, and
       (iv) a common package at least partially encapsulating both of said first and second pairs of stacked dies.

13. The memory module as claimed in claim 12 wherein an insulator is disposed between said first pair of stacked memory dies.

14. The memory module as claimed in claim 13 wherein an insulator is disposed between said second pair of stacked memory dies.

15. The memory module as claimed in claim 12 wherein said first and second pairs of stacked memory dies are identical.

* * * * *